United States Patent
Morimoto et al.

(10) Patent No.: US 8,048,769 B2
(45) Date of Patent: Nov. 1, 2011

(54) METHOD FOR PRODUCING BONDED WAFER

(75) Inventors: Nobuyuki Morimoto, Tokyo (JP); Akihiko Endo, Tokyo (JP); Etsurou Morita, Tokyo (JP)

(73) Assignee: Sumco Corporation, Tokyo (JP)

( * ) Notice: Subject to any disclaimer, the term of this patent is extended or adjusted under 35 U.S.C. 154(b) by 34 days.

(21) Appl. No.: 12/064,605

(22) PCT Filed: Jul. 4, 2007

(86) PCT No.: PCT/JP2007/063387
§ 371 (c)(1),
(2), (4) Date: Aug. 27, 2009

(87) PCT Pub. No.: WO2008/004591
PCT Pub. Date: Jan. 10, 2008

(65) Prior Publication Data
US 2010/0015779 A1    Jan. 21, 2010

(30) Foreign Application Priority Data

Jul. 4, 2006 (JP) ................................. 2006-184237

(51) Int. Cl.
*H01L 21/762* (2006.01)
(52) U.S. Cl. ............................ 438/458; 257/E21.568
(58) Field of Classification Search .................. 438/455, 438/458; 257/E21.568
See application file for complete search history.

(56) References Cited

U.S. PATENT DOCUMENTS

| | | | |
|---|---|---|---|
| 2005/0014346 A1 | 1/2005 | Mitani et al. | |
| 2006/0113594 A1* | 6/2006 | Sakurada et al. | 257/347 |
| 2008/0044669 A1* | 2/2008 | Adachi | 428/446 |
| 2009/0042364 A1* | 2/2009 | Yagi | 438/459 |
| 2009/0090933 A1* | 4/2009 | Ninomiya et al. | 257/190 |

FOREIGN PATENT DOCUMENTS

| | | |
|---|---|---|
| EP | 1045448 A1 | 10/2000 |
| JP | 2004-055752 A | 2/2004 |
| WO | 0024059 A1 | 4/2000 |
| WO | 2004010505 A1 | 1/2004 |
| WO | 2004064145 A1 | 7/2004 |
| WO | 2005067053 A1 | 7/2005 |
| WO | 2005/074033 A1 | 8/2005 |
| WO | 2005074033 A1 | 8/2005 |

OTHER PUBLICATIONS

European Search Report dated Jan. 26, 2011 for corresponding European patent application No. 07768139.3.

* cited by examiner

*Primary Examiner* — Thao Le
(74) *Attorney, Agent, or Firm* — Sughrue Mion, PLLC

(57) ABSTRACT

There is provided a bonded wafer having excellent thickness uniformity after thinning but also good surface roughness and being less in defects.

In the production method of a bonded wafer by bonding a wafer for active layer to a wafer for support substrate and thinning the wafer for active layer, oxygen ions are implanted into the wafer for active layer to form an oxygen ion implanted layer in the active layer and thereafter a heat treatment is carried out in a non-oxidizing atmosphere at a temperature of not lower than 1100° C., and an oxide film formed on the exposed surface of the oxygen ion implanted layer is removed and then a heat treatment is carried out in a non-oxidizing atmosphere at a temperature of not higher than 1100° C.

16 Claims, 1 Drawing Sheet

METHOD FOR PRODUCING BONDED WAFER

TECHNICAL FIELD

This invention is to effectively prevent deterioration of surface roughness and occurrence of defects particularly resulted from oxygen ion implanted layer in the production of a bonded wafer.

RELATED ART

As a typical production method of a bonded wafer, there are known a method wherein a silicon wafer provided with an oxide film (insulating film) is bonded to another silicon wafer and then the resulting bonded wafer is subjected to grinding-polishing treatments to form SOI layer (grinding-polishing method), and a method wherein hydrogen ions or the like are implanted onto a surface layer portion of a silicon wafer (wafer for active layer) for the formation of SOI layer to form an ion implanted layer and thereafter bonded to a silicon wafer for support substrate and then exfoliated at the ion implanted layer through heat treatment to form SOI layer (smart cut method).

In such silicon wafers, it is important to make the thickness of the SOI layer thin and uniform. The inventors have disclosed the production technique of SOI wafer satisfying such requirements in Patent Document 1.

Patent Document 1: WO 2005/074033 A1

DISCLOSURE OF THE INVENTION

Problems to be Solved by the Invention

In the technique disclosed in the above patent document 1, the thickness uniformity after the thinning is good, but there may be deteriorated the surface roughness or caused defects after the thinning.

This is considered due to the fact that oxygen ions introduced in the oxygen ion implantation are existent at a discontinuous state without forming a complete oxide film and bring about the deterioration of surface roughness or the occurrence of defects at a subsequent step (at a time of exposing the oxygen ion implanted layer).

The deterioration of surface roughness or the occurrence of defects may be improved by an oxidation treatment at the subsequent step or at a step of removing the oxide film. Particularly, it is feared that the defects are enlarged at the heat treatment step.

Means for Solving Problems

The inventors have made various studies in order to achieve the above object and found the followings:

(1) When the bonded wafer is prepared by the grinding-polishing method, the wafer for active layer is subjected to a heat treatment of not lower than 1100° C. in an atmosphere of hydrogen gas or argon gas or a mixed gas thereof for not less than 1 hour after the oxygen ion implantation, whereby the formation of the oxygen ion implanted layer is made at a relatively continuous state, and at the subsequent time of exposing the oxygen ion implanted layer, the surface roughness is improved and the occurrence of defects is suppressed as compared with the case of conducting no heat treatment before the bonding.

In case of preparing the bonded wafer by the smart cut method, the same effects as in the grinding-polishing method are also obtained by conducting the heat treatment of not lower than 1100° C. in an atmosphere of hydrogen gas or argon or a mixed gas thereof for not less than 1 hour after the oxygen ion implantation.

(2) Even in any of the grinding-polishing method and the smart cut method, it is possible to conduct further planarization by heat-treating the bonded wafer after thinning at a temperature of not higher than 1100° C. in a non-oxidizing atmosphere such as hydrogen, argon gas or the like. Furthermore, oxides retained at the bonded interface can be removed by this heat treatment.

Particularly, this effect is very effective when silicon wafers having no insulating film are directly bonded to each other.

The invention is based on the above knowledge.

That is, the summary and construction of the invention are as follows.

1. A method for producing a bonded wafer by directly bonding a wafer for active layer having or not having an insulating film on its surface to a wafer for support layer and then thinning the wafer for active layer, which comprises a time-oriented combination of:

a step of implanting oxygen ions into the wafer for active layer to form an oxygen ion implanted layer in the active layer;

a step of subjecting the wafer for active layer to a heat treatment at a temperature of not lower than 1100° C. in a non-oxidizing atmosphere;

a step of bonding the wafer for active layer to a wafer for support layer;

a step of heat-treating for improving a bonding strength;

a step of grinding a portion of the wafer for active layer in the bonded wafer short of the oxygen ion implanted layer;

a step of further polishing or etching the wafer for active layer to expose the oxygen ion implanted layer;

a step of oxidizing the bonded wafer to form an oxide film on the exposed surface of the oxygen ion implanted layer;

a step of removing the oxide film; and a step of heat-treating at a temperature of not higher than 1100° C. in a non-oxidizing atmosphere.

2. A method for producing a bonded wafer by implanting ions of hydrogen or rare gas element into a wafer for active layer having or not having an insulating film on its surface to form an ion implanted layer, directly bonding the wafer for active layer to a wafer for support layer and then exfoliating a part of the wafer for active layer at the ion implanted layer as a border through an exfoliation heat treatment, which comprises a time-oriented combination of:

a step of subjecting the bonded wafer after the exfoliation to a heat treatment for improving a bonding strength and removing a damaged layer due to the exfoliation;

a step of implanting oxygen ions from a surface of the wafer for active layer to form an oxygen ion implanted layer in the active layer;

a step of subjecting the bonded wafer to a heat treatment at a temperature of not lower than 1100° C. in a non-oxidizing atmosphere;

a step of polishing or etching the wafer for active layer from the exfoliated surface to the oxygen ion implanted layer to expose the oxygen ion implanted layer;

a step of oxidizing the bonded wafer to form an oxide film on the exposed surface of the oxygen ion implanted layer;

a step of removing the oxide film; and a step of heat-treating at a temperature of not higher than 1100° C. in a non-oxidizing atmosphere.

3. A method for producing a bonded wafer by directly bonding a wafer for active layer having or not having an insulating film on its surface to a wafer for support layer and then thinning the wafer for active layer, which comprises a time-oriented combination of:

a step of implanting oxygen ions into the wafer for active layer to form an oxygen ion implanted layer in the active layer;

a step of subjecting the wafer for active layer to a heat treatment at a temperature of not lower than 1100° C. in a non-oxidizing atmosphere;

a step of bonding the wafer for active layer to a wafer for support layer;

a step of heat-treating for improving a bonding strength;

a step of grinding a portion of the wafer for active layer in the bonded wafer short of the oxygen ion implanted layer;

a step of further polishing or etching the wafer for active layer to expose the oxygen ion implanted layer;

a step of oxidizing the bonded wafer to oxidize the oxygen ion implanted layer;

a step of removing an oxide layer; and a step of heat-treating at a temperature of not higher than 1100° C. in a non-oxidizing atmosphere.

4. A method for producing a bonded wafer by directly bonding a wafer for active layer having or not having an insulating film on its surface to a wafer for support layer and then thinning the wafer for active layer, which comprises a time-oriented combination of:

a step of implanting oxygen ions into the wafer for active layer to form an oxygen ion implanted layer in the active layer;

a step of subjecting the wafer for active layer to a heat treatment at a temperature of not lower than 1100° C. in a non-oxidizing atmosphere;

a step of bonding the wafer for active layer to a wafer for support layer;

a step of heat-treating for improving a bonding strength;

a step of grinding a portion of the wafer for active layer in the bonded wafer short of the oxygen ion implanted layer;

a step of further polishing or etching the wafer for active layer to expose the oxygen ion implanted layer;

a step of oxidizing the bonded wafer to oxidize the oxygen ion implanted layer;

a step of removing an oxide layer;

a step of again subjecting the bonded wafer to an oxidization treatment;

a step of removing an oxidized portion of the wafer; and a step of heat-treating at a temperature of not higher than 1100° C. in a non-oxidizing atmosphere.

5. A method for producing a bonded wafer according to any one of items 1-4, wherein the insulating film on the surface of the wafer for active layer has a thickness of not more than 50 nm.

6. A method for producing a bonded wafer according to any one of items 1-5, wherein an oxygen dose in the step of forming the oxygen ion implanted layer is $5.0 \times 10^{16}$-$5.0 \times 10^{17}$ atoms/cm$^2$.

Effect of the Invention

According to the invention, there can be stably obtained the bonded wafer having not only the excellent thickness uniformity after the thinning but also good surface roughness and being less in the defects.

BEST MODE FOR CARRYING OUT THE INVENTION

Figure 1:
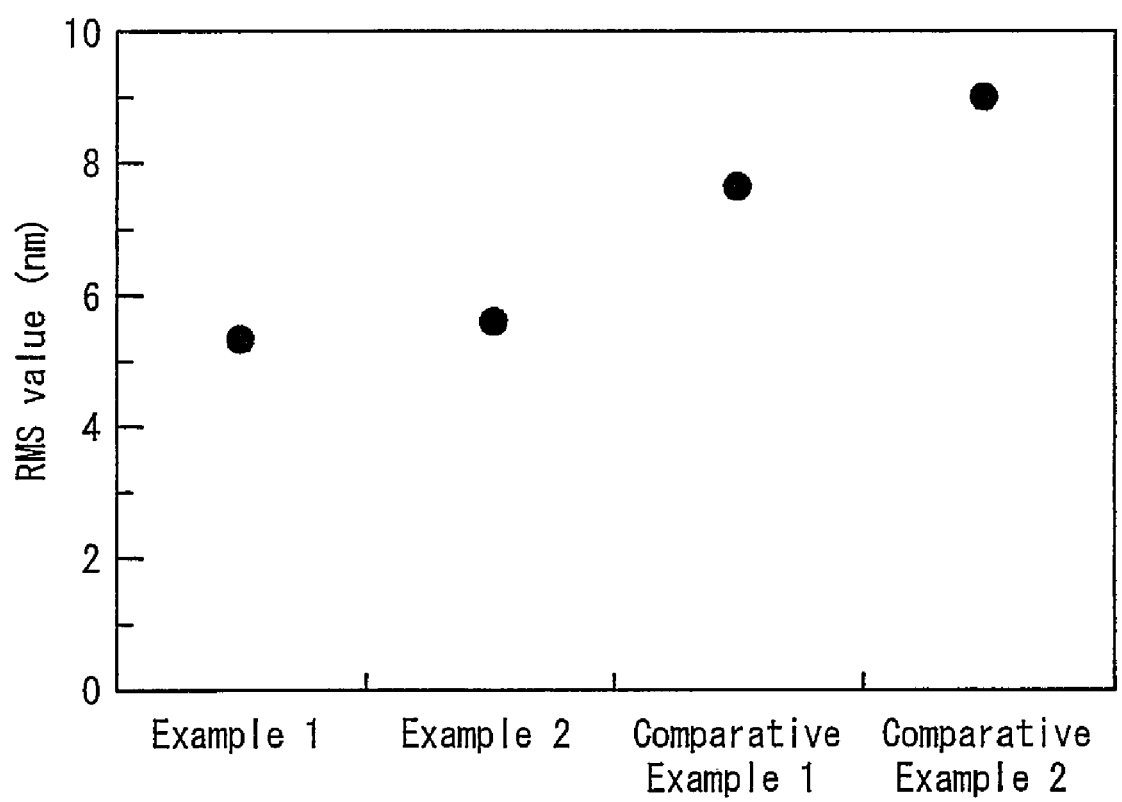
FIG. 1 is a view showing a comparison of surface roughness among Examples 1 and 2 and Comparative Examples 1 and 2.

The invention will be concretely described below.

In the production of the bonded wafer, two silicon wafers, i.e. a wafer for active layer and a wafer for support layer are bonded to each other. In the invention, as the wafer for active layer may be applied not only a wafer having an insulating film (oxide film) on the surface thereof but also a wafer having no insulating layer even in the direct bonding to the wafer for support layer.

In the production method of such a bonded wafer, the invention effectively prevents the deterioration of surface roughness and the occurrence of defects, which are feared when the thickness of the insulating film is as thin as not more than 50 nm, particularly when the insulating film is not existent.

At first, there will be described the production of the bonded wafer by so-called grinding-polishing method.

In the grinding-polishing method, oxygen ions are first implanted into the wafer for active layer to form an oxygen ion implanted layer in the active layer. Afterward, an oxide film will be formed on the surface of the oxygen ion implanted layer.

The acceleration voltage and dose of oxygen ions to be implanted into the wafer for active layer are not particularly limited, and may be properly selected in accordance with the target thickness of the active layer. Preferably, the acceleration voltage is within a range of 100-300 keV, and the dose of oxygen ions is within a range of $5.0 \times 10^{16}$-$5.0 \times 10^{17}$ atoms/cm$^2$.

In the invention, the wafer for active layer having the oxygen ion implanted layer formed in the active layer is subjected to a heat treatment at a temperature of not lower than 1100° C. in a non-oxidizing atmosphere such as hydrogen, argon or the like. As a result, the form of the oxygen ion implanted layer becomes at a relatively continuous state, and the surface roughness is highly improved and the occurrence of defects can be suppressed at the subsequent time of exposing the oxygen ion implanted layer.

The heat treating temperature is required to be not lower than 1100° C. as mentioned above. When the heat treating temperature is lower than 1100° C., the oxygen ion implanted layer having a sufficient continuity is not formed and only the result similar to the case not conducting the heat treatment is obtained. On the other hand, if the heat treating temperature exceeds 1250° C., there is a fear of generating slip transference. Therefore, the heat treating temperature is preferable to be within a range of 1100-1250° C.

Also, the heat treatment can be applied to a batch type furnace but also various heating systems such as sheet-feed type lamp heating, resistance heating, flash annealing and the like and is not particularly limited. It is preferable that the heat treatment is conducted for not less than 1 hour in case of using the batch type furnace and for not less than 10 seconds in case of using the sheet-feed furnace. In short, it is enough to optimize the heat treating time of each of the apparatuses considering the productivity.

Then, the wafer for active layer is bonded to the wafer for support layer.

Moreover, it is very effective to remove organic matter from the bonding surfaces of the wafers by a plasma treatment using nitrogen, oxygen, argon, diluted hydrogen or a mixed gas thereof just before the bonding in view that void defects resulted from the organic matter are suppressed to improve the yield.

Thereafter, a heat treatment is carried out for improving the bonding strength. In this heat treatment, the atmosphere is not particularly limited, but the treating temperature and time are preferable to be about 1200° C. and 60 minutes, respectively.

Then, a portion of the wafer for active layer in the bonded wafer is ground short of the oxygen ion implanted layer. Typically, the grinding is carried out by a mechanical work.

Subsequently, the wafer for active layer is further polished or etched to expose the oxygen ion implanted layer.

When the polishing treatment is utilized as such a thinning treatment, it is preferable to be conducted while feeding an abrading agent having an abrasive grain concentration of not more than 1 mass %. As such an abrading liquid is mentioned an alkaline solution having an abrasive grain (e.g. silica) concentration of not more than 1 mass %. As the alkaline solution is preferable an inorganic alkali solution (KOH, NaOH or the like), an organic alkali solution (for example, piperazine containing an amine as a main component, ethylene diamine or the like), or a mixed solution thereof.

In such an abrading solution, since the abrasive grain concentration is not more than 1 mass %, the mechanical polishing action through abrasive grains is not substantially caused, while the chemical polishing action with the alkaline solution is preferential. The alkaline solution can polish Si layer efficiently because $Si/SiO_2$ etching rate ratio is high.

Also, in case of using the etching treatment, an alkaline etching liquid (liquid temperature: 85° C.) obtained by dissolving KOH in pure water (DIW) is preferable as an etching liquid. In such an etching liquid is immersed the bonded wafer after the grinding. Moreover, the concentration of KOH in the alkaline etching liquid is preferable to be about 10 mass %, and also it is advantageous to add about 0.1 mass % of hydrogen peroxide ($H_2O_2$) to the etching liquid.

Thus, the etching rate ratio of $Si/SiO_2$ becomes not less than 300 and the oxide film ($SiO_2$) is hardly dissolved, so that only Si layer is effectively removed when the etching is carried out by using the above alkaline etching liquid.

As mentioned above, the Si layer partly retained after the grinding is polished to expose the oxygen ion implanted layer. In this case, the chemical polishing with the alkaline liquid does not act on the oxygen ion implanted layer, so that the oxygen ion implanted layer is not substantially polished. As a result, the oxygen ion implanted layer can be exposed uniformly.

Then, the bonded wafer is subjected to an oxidation treatment to form an oxide film having a given thickness on the exposed surface of the oxygen ion implanted layer.

The oxidation treatment is sufficient to be conducted in an oxidizing atmosphere, so that the treating temperature is not particularly limited. The oxidizing atmosphere of 600-1000° C. is preferable.

The thickness of the oxide film formed is not particularly limited, but is preferable to be about 100-500 nm.

Next, the oxide film is removed.

The removal of the oxide film is may be conducted by cleaning with HF liquid or by etching through annealing with hydrogen gas, Ar gas or a gas containing HF.

The above oxidation treatment and removal treatment may be conducted plural times. Thus, it is possible to conduct more thinning of the active layer while maintaining the planarized surface roughness. That is, if it is intended to increase a removal stock of the active layer for the more thinning, the oxide film is formed by the oxidation treatment and thereafter the step of removing the oxide film by HF etching is repeated to make the active layer more thinner.

Moreover, it is advantageous that after the removal of the oxide film, the bonded wafer is immersed in a mixed solution of an organic acid and hydrofluoric acid to remove particles and metallic impurity adhered to the surface of the bonded wafer.

In the invention, the thinned bonded wafer is then subjected to a heat treatment at a temperature of not higher than 1100° C. in a non-oxidizing atmosphere such as hydrogen gas, argon gas or the like. By this heat treatment is attained a more planarization and also an oxide retained at the bonded interface can be removed.

This effect is remarkable when the thickness of the insulating film is not more than 50 nm or when silicon wafers having no insulating film are directly bonded to each other.

Although the planarization is promoted even if the heat treating temperature exceeds 1100° C., it is important that the temperature is not higher than 1100° C. considering the thickness uniformity of the active layer and the effect of removing the residue on the bonded interface. That is, when the temperature exceeds 1100° C., there is a possibility that the etching of the active layer is promoted to deteriorate the thickness uniformity. Also, as the temperature becomes higher, there is a fear that the oxide retained on the bonded interface is easily diffused into the side of the active layer to locally etch the active layer to thereby generate pit-like defects on the surface thereof. Therefore, the heat treating temperature is limited to not higher than 1100° C. Nevertheless, when the heat treating temperature is lower than 1000° C., the above effect is not obtained, so that the heat treating temperature is preferable to be not lower than 1000° C.

Thus, there can be obtained a bonded wafer having an excellent thickness uniformity and a planarized surface roughness and being less in defects.

Next, the production of the bonded wafer through so-called smart cut method will be described.

In the smart cut method, ions of hydrogen or rare gas element are first implanted into a wafer for active layer to form an ion implanted layer. This ion implanted layer plays a role as a boundary when a part of the wafer for active layer is exfoliated through cleavage afterward.

Then, the wafer for active layer is bonded to a wafer for support layer.

Thereafter, the bonded wafer is subjected to an exfoliation heat treatment, whereby a part of the wafer for active layer is exfoliated at the ion implanted layer as a boundary.

The exfoliation heat treatment may be conducted at a temperature of about 500° C. according to usual manner. As a result, the bonded wafer is completely exfoliated over the full face at the ion implanted layer as a boundary.

The bonded wafer after the exfoliation is subjected to a heat treatment for improving a bonding strength and removing a damaged layer due to the exfoliation.

As long as the heat treatment is carried out in an oxidizing atmosphere, the treating temperature, treating time and oxidation method are not particularly limited, but a condition capable of removing the thickness of the damaged layer generated in the exfoliation is required. For example, when the damaged layer is 100 nm, a thickness forming the oxide film is required to be not less than 200 nm.

Then, oxygen ions are implanted into the surface of the wafer for active layer to form an oxygen ion implanted layer in the active layer.

The formation of the oxygen ion implanted layer may be carried out in the same manner as in the aforementioned grinding-polishing method. However, it is required to previously determine a depth forming the oxygen ion implanted layer when the acceleration voltage is, for example, 30-50 keV as the implantation condition considering the final thickness of the active layer.

Further, the bonded wafer is subjected to a heat treatment at a temperature of not lower than 1100° C. in a non-oxidizing atmosphere.

By this treatment is rendered the form of the oxygen ion implanted layer into a relatively continuous state, and the surface roughness is highly improved and the occurrence of defects can be suppressed at the subsequent time of exposing the oxygen ion implanted layer.

The conditions of the heat treatment and furnace used may be the same as in the aforementioned grinding-polishing method.

Next, the wafer for active layer ranging from the exfoliated surface to the oxygen ion implanted layer is polished or etched to expose the oxygen ion implanted layer, and thereafter the bonded wafer is oxidized to form an oxide film at a given thickness on the exposed surface of the oxygen ion implanted layer, and then the oxide film is removed. The polishing or etching treatment, formation treatment of the oxide film and removal treatment of the oxide film may be the same as in the aforementioned grinding-polishing method.

Thereafter, the wafer is subjected to a heat treatment at a temperature of not higher than 1100° C. in a non-oxidizing atmosphere such as hydrogen gas, argon gas or the like.

By this heat treatment can be attained the more planarization and the removal of oxide retained at the bonded interface a previously mentioned.

This effect becomes remarkable when the thickness of the insulating film is not more than 50 nm or when silicon wafers having no insulating film are directly bonded to each other.

Even in the case of utilizing the smart cut method, there is stably obtained a bonded wafer having an excellent thickness uniformity and a planarized surface roughness and being less in defects.

According to the invention, it is also possible to prepare a bonded wafer by directly bonding silicon wafers having different crystal orientations to each other (e.g. bonding of 110 crystal and 100 crystal, bonding of 111 crystal and 100 crystal, or the like).

EXAMPLES

Example 1

There are provided two silicon wafers of 300 mm in diameter obtained by slicing a silicon ingot grown by CZ method and doped with boron. Oxygen ions are implanted into a surface of a wafer for active layer under conditions of an acceleration voltage: 150 keV and a dose: $5.0 \times 10^{16}$ atoms/cm$^2$. As a result, an oxygen ion implanted layer is formed at a depth position of about 300 nm from the surface of the wafer for active layer.

Then, the wafer is subjected to a heat treatment at 1200° C. in an argon gas atmosphere for 1 hour and directly bonded at the oxygen ion implanted surface as a bonding face to a wafer for support layer.

Thereafter, the bonded wafer is subjected to a heat treatment at 1100° C. in an oxidizing gas atmosphere for 2 hours in order to make the bonded interface stronger.

Next, the bonded wafer is ground from the surface of the wafer for active layer by a given thickness by using a grinding apparatus. Thus, a part of the wafer for active layer (thickness: about 5 μm) is left on the surface side of the oxygen ion implanted layer.

Then, the oxygen ion implanted layer is exposed by polishing the surface of the bonded wafer after the grinding while feeding an abrading agent having an abrasive grain (silica) concentration of not more than 1 mass %. As the abrading agent is used an alkaline liquid having an abrasive grain concentration of not more than 1 mass %. Moreover, it has been confirmed that the exposed oxygen ion implanted layer is uniformly formed in the surface of the bonded wafer.

Thereafter, the bonded wafer is subjected to a wet oxidation treatment in an oxidizing atmosphere at a temperature of 950° C. for 0.5 hour. As a result, an oxide film having a thickness of 150 nm is formed on the exposed surface of the oxygen ion implanted layer. Next, the oxide film is removed by cleaning with HF.

Then, the bonded wafer is finished by subjecting to a heat treatment in an argon gas atmosphere at 1100° C. for 1 hour.

With respect to the thus obtained bonded wafer, the surface roughness (RMS value) is measured by using an atomic force microscope, and also the presence or absence of defects in the vicinity of the surface is measured by a section TEM.

The obtained results are collectively shown in FIG. 1 and Table 1.

Example 2

There are provided two silicon wafers of 300 mm in diameter obtained by slicing a silicon ingot grown by CZ method and doped with boron. Hydrogen ions are implanted into a surface of a silicon wafer as a wafer for active layer under conditions of an acceleration voltage: 50 keV and a dose: 1.0×1017 atoms/cm$^2$. As a result, a hydrogen ion implanted layer is formed at a depth position of about 450 nm from the surface of the wafer for active layer.

Next, the silicon wafer is directly bonded to a wafer for support substrate and thereafter subjected to an exfoliation heat treatment. In this case, the exfoliation heat treatment is carried out in a nitrogen gas atmosphere at 500° C. for 30 minutes. As a result, bubbles of hydrogen gas are formed in the hydrogen ion implanted layer, and a part of the bonded wafer (a part of the wafer for active layer) is exfoliated at the hydrogen ion implanted layer provided with the bubbles as a boundary. Thus, the bonded wafer is formed.

Thereafter, the wafer is subjected to a heat treatment in an oxygen atmosphere at 950° for 0.5 hour (wet) in order to remove damages in the exfoliation and strongly bond the bonded interface.

After the oxide film is removed by cleaning with HF, oxygen ions are implanted from the exfoliated surface of the bonded wafer. The implantation conditions are an acceleration voltage: 40 keV and a dose: 5.0×1016 atoms/cm$^2$. Thus, an oxygen ion implanted layer is formed at a depth position of about 50 nm from the exfoliated surface of the bonded wafer.

Further, the wafer is subjected to a heat treatment in an argon gas atmosphere at 1200° C. for 1 hour in order to more continue the formation of the oxygen ion implanted layer.

Then, the surface of the oxygen ion implanted layer is exposed by polishing the surface of the bonded wafer while feeding an abrading agent having an abrasive grain concentration of not more than 1 mass %. This polishing method is the same as in Example 1.

Thereafter, the wafer is subjected to a wet oxidation treatment in an oxidizing atmosphere at a temperature of 950° C. for 0.5 hour to form an oxide film having a thickness of 150 nm on the exposed surface of the oxygen ion implanted layer. Then, the oxide film is removed by cleaning with HF.

Next, the bonded wafer is finished by subjecting to a heat treatment in an argon gas atmosphere at 1100° C. for 1 hour.

With respect to the thus obtained bonded wafer, the surface roughness is measured by using an atomic force microscope, and also the presence or absence of defects in the vicinity of the surface is measured by a section TEM.

The obtained results are collectively shown in FIG. 1 and Table 1.

Comparative Example 1

There are provided two silicon wafers of 300 mm in diameter obtained by slicing a silicon ingot grown by CZ method and doped with boron. Oxygen ions are implanted into a surface of a wafer for active layer under conditions of an acceleration voltage: 150 keV and a dose: $5.0 \times 10^{16}$ atoms/$cm^2$.

Then, the wafer is directly bonded at the oxygen ion implanted surface as a bonding face to a wafer for support substrate without conducting the heat treatment.

Thereafter, the wafer is subjected to a heat treatment in an oxidizing gas atmosphere at 1100° C. for 2 hours in order to strongly bond the bonded face.

Next, the surface of the oxygen ion implanted layer is exposed by grinding and polishing in the same manner as in Example 1.

Thereafter, the formation and removal of an oxide film are carried out in the same manner as in Example 1 to prepare a bonded wafer.

With respect to the thus obtained bonded wafer, the surface roughness is measured by using an atomic force microscope, and also the presence or absence of defects in the vicinity of the surface is measured by a section TEM.

The obtained results are collectively shown in FIG. 1 and Table 1.

Comparative Example 2

An oxygen ion implanted layer is formed in an active layer by implanting oxygen ions into an exfoliated face in the same manner as in Example 2.

Then, the surface of the oxygen ion implanted layer is exposed by polishing the surface of the bonded wafer in the same manner as in Example 2 without conducting the heat treatment.

Thereafter, the formation and removal of an oxide film are carried out in the same manner as in Example 2 to prepare a bonded wafer.

With respect to the thus obtained bonded wafer, the surface roughness is measured by using an atomic force microscope, and also the presence or absence of defects in the vicinity of the surface is measured by a section TEM.

The obtained results are collectively shown in FIG. 1 and Table 1.

TABLE 1

|  | Presence or absence of defects |
| --- | --- |
| Example 1 | absence |
| Example 2 | absence |
| Comparative Example 1 | presence |
| Comparative Example 2 | presence |

As seen from FIG. 1 and Table 1, when Examples 1 and 2 are compared with Comparative Examples 1 and 2, the surface roughness is largely improved, and also there is no occurrence of defects.

Example 3

A bonded wafer is prepared in the same manner as in Example 1 except that an oxide film of 5 nm in thickness is formed in the wafer for active layer after the oxygen ion implantation.

As a result, the thus obtained bonded wafer has no defect likewise Example 1, and the surface roughness thereof is 5-6 nm.

Example 4

A bonded wafer is prepared in the same manner as in Example 2 except that an oxide film of 5 nm is formed on the wafer for active layer before hydrogen ion implantation.

As a result, the thus obtained bonded wafer has no defect likewise Example 2, and the surface roughness thereof is 5-6 nm.

The invention claimed is:

1. A method for producing a bonded wafer by directly bonding a wafer for active layer to a wafer for support layer and then thinning the wafer for active layer, which comprises a time-oriented combination of:

implanting oxygen ions into the wafer for active layer to form an oxygen ion implanted layer in the active layer;

subjecting the wafer for active layer to a heat treatment at a temperature of not lower than 1100° C. in a non-oxidizing atmosphere;

bonding the wafer for active layer to a wafer for support layer;

heat-treating for improving a bonding strength;

grinding a portion of the wafer for active layer in the bonded wafer that does not include of the oxygen ion implanted layer;

further polishing or etching the wafer for active layer to expose the oxygen ion implanted layer;

oxidizing the bonded wafer to form an oxide film on the exposed surface of the oxygen ion implanted layer;

removing the oxide film; and heat-treating at a temperature of not higher than 1100° C. in a non-oxidizing atmosphere.

2. A method for producing a bonded wafer by implanting ions of hydrogen or rare gas element into a wafer for active layer having or not having an insulating film on its surface to form an ion implanted layer, directly bonding the wafer for active layer to a wafer for support layer and then exfoliating a part of the wafer for active layer at the ion implanted layer as a border through an exfoliation heat treatment, which comprises a time-oriented combination of:

subjecting the bonded wafer after the exfoliation to a heat treatment for improving a bonding strength and removing a damaged layer due to the exfoliation;

implanting oxygen ions from a surface of the wafer for active layer to form an oxygen ion implanted layer in the active layer;

subjecting the bonded wafer to a heat treatment at a temperature of not lower than 1100° C. in a non-oxidizing atmosphere;

polishing or etching the wafer for active layer from the exfoliated surface to the oxygen ion implanted layer to expose the oxygen ion implanted layer;

oxidizing the bonded wafer to form an oxide film on the exposed surface of the oxygen ion implanted layer;
removing the oxide film; and
heat-treating at a temperature of not higher than 1100° C. in a non-oxidizing atmosphere.

3. A method for producing a bonded wafer by directly bonding a wafer for active layer having or not having an insulating film on its surface to a wafer for support layer and then thinning the wafer for active layer, which comprises a time-oriented combination of:
implanting oxygen ions into the wafer for active layer to form an oxygen ion implanted layer in the active layer;
subjecting the wafer for active layer to a heat treatment at a temperature of not lower than 1100° C. in a non-oxidizing atmosphere;
bonding the wafer for active layer to a wafer for support layer;
heat-treating for improving a bonding strength;
grinding a portion of the wafer for active layer in the bonded wafer short of the oxygen ion implanted layer;
further polishing or etching the wafer for active layer to expose the oxygen ion implanted layer;
oxidizing the bonded wafer to oxidize the oxygen ion implanted layer;
removing an oxide layer; and
heat-treating at a temperature of not higher than 1100° C. in a non-oxidizing atmosphere.

4. A method for producing a bonded wafer by directly bonding a wafer for active layer having or not having an insulating film on its surface to a wafer for support layer and then thinning the wafer for active layer, which comprises a time-oriented combination of:
implanting oxygen ions into the wafer for active layer to form an oxygen ion implanted layer in the active layer;
subjecting the wafer for active layer to a heat treatment at a temperature of not lower than 1100° C. in a non-oxidizing atmosphere;
bonding the wafer for active layer to a wafer for support layer;
heat-treating for improving a bonding strength;
grinding a portion of the wafer for active layer in the bonded wafer short of the oxygen ion implanted layer;
further polishing or etching the wafer for active layer to expose the oxygen ion implanted layer;
oxidizing the bonded wafer to oxidize the oxygen ion implanted layer;
removing an oxide layer;
again subjecting the bonded wafer to an oxidization treatment;
removing an oxidized portion of the wafer; and
heat-treating at a temperature of not higher than 1100° C. in a non-oxidizing atmosphere.

5. A method for producing a bonded wafer according to claim 1, wherein the insulating film on the surface of the wafer for active layer has a thickness of not more than 50 nm.

6. A method for producing a bonded wafer according to claim 1, wherein an oxygen dose in the step of forming the oxygen ion implanted layer is $5.0\times10^{16}$-$5.0\times10^{17}$ atoms/cm$^2$.

7. A method for producing a bonded wafer according to claim 2, wherein the insulating film on the surface of the wafer for active layer has a thickness of not more than 50 nm.

8. A method for producing a bonded wafer according to claim 3, wherein the insulating film on the surface of the wafer for active layer has a thickness of not more than 50 nm.

9. A method for producing a bonded wafer according to claim 4, wherein the insulating film on the surface of the wafer for active layer has a thickness of not more than 50 nm.

10. A method for producing a bonded wafer according to claim 2, wherein an oxygen dose in the step of forming the oxygen ion implanted layer is $5.0\times10^{16}$-$5.0\times10^{17}$ atoms/cm$^2$.

11. A method for producing a bonded wafer according to claim 3, wherein an oxygen dose in the step of forming the oxygen ion implanted layer is $5.0\times10^{16}$-$5.0\times10^{17}$ atoms/cm$^2$.

12. A method for producing a bonded wafer according to claim 4, wherein an oxygen dose in the step of forming the oxygen ion implanted layer is $5.0\times10^{16}$-$5.0\times10^{17}$ atoms/cm$^2$.

13. A method for producing a bonded wafer according to claim 5, wherein an oxygen dose in the step of forming the oxygen ion implanted layer is $5.0\times10^{16}$-$5.0\times10^{17}$ atoms/cm$^2$.

14. A method for producing a bonded wafer according to claim 7, wherein an oxygen dose in the step of forming the oxygen ion implanted layer is $5.0\times10^{16}$-$5.0\times10^{17}$ atoms/cm$^2$.

15. A method for producing a bonded wafer according to claim 8, wherein an oxygen dose in the step of forming the oxygen ion implanted layer is $5.0\times10^{16}$-$5.0\times10^{17}$ atoms/cm$^2$.

16. A method for producing a bonded wafer according to claim 9, wherein an oxygen dose in the step of forming the oxygen ion implanted layer is $5.0\times10^{16}$-$5.0\times10^{17}$ atoms/cm$^2$.

* * * * *